United States Patent
Kawakami et al.

[11] Patent Number: 5,889,426
[45] Date of Patent: Mar. 30, 1999

[54] INTEGRATED CIRCUIT DEVICE HAVING A BIAS CIRCUIT FOR AN ENHANCEMENT TRANSISTOR CIRCUIT

[75] Inventors: Masayuki Kawakami; Yoshiyasu Tsuruoka, both of Sapporo; Hideo Abe, Sagamihara, all of Japan

[73] Assignee: Fujitsu Limited, Kanagawa, Japan

[21] Appl. No.: 908,720

[22] Filed: Aug. 8, 1997

[30] Foreign Application Priority Data

Mar. 19, 1997 [JP] Japan .................................. 9-065755

[51] Int. Cl.⁶ ............................................ G05F 1/10
[52] U.S. Cl. ................. 327/530; 327/541; 327/543; 323/313
[58] Field of Search ....................... 327/530, 538, 327/540, 541, 543, 546, 307; 323/312, 313, 314

[56] References Cited

U.S. PATENT DOCUMENTS

| | | | |
|---|---|---|---|
| 4,833,344 | 5/1989 | Moon et al. | 323/312 |
| 5,030,903 | 7/1991 | Bernard et al. | 323/313 |
| 5,126,653 | 6/1992 | Ganesan et al. | 327/530 |
| 5,327,072 | 7/1994 | Savignac et al. | 327/530 |
| 5,552,740 | 9/1996 | Casper | 327/541 |

*Primary Examiner*—Timothy P. Callahan
*Assistant Examiner*—Jung Ho Kim
*Attorney, Agent, or Firm*—Nikaido Marmelstein Murray & Oram, LLP

[57] ABSTRACT

Disclosed is an integrated circuit device. According to the present invention, an integrated circuit device comprises: a high frequency electronic circuit having a first enhancement transistor, to the gate of which, at least, a bias voltage is applied; and a bias circuit, including a second enhancement transistor formed on a substrate on which the first enhancement transistor is formed, and first, second and third resistors connected in series between a positive power source and a power source ground, in which a connection point of the first and the second resistors is connected to a drain of the second enhancement transistor, a connection point of the second and the third resistors is connected to a gate of the second enhancement transistor, and voltages at the connection point of the second resistor and the third resistor or at a terminal which is closer to the power source ground is applied as a bias voltage to the high frequency electronic circuit.

4 Claims, 8 Drawing Sheets

INTEGRATED CIRCUIT DEVICE HAVING A BIAS CIRCUIT FOR AN ENHANCEMENT TRANSISTOR CIRCUIT

BACKGROUND OF THE INVENTION

1. Field of the Invention

The present invention relates to a bias circuit of a high frequency electronic circuit having enhancement FET formed on a semiconductor substrate, such as GaAs, and in particular to a bias circuit for supplying a bias voltage associated with a transistor characteristic, even though the transistor characteristic varies due to differences during the manufacturing process.

2. Related Arts

An MMIC (Microwave Monolithic Integrated Circuit) wherefor a plurality of metal gate FET devices are integrated on a semiconductor substrate, such as GaAs or Si, is commonly utilized to provide a compact hardware for processing a high frequency signal in, for example, a portable telephone. A MMIC circuit is employed, for example, as an amplifier to amplify power relative to high frequency input and generate a high powered high frequency output, or as a mixer circuit that converts a high frequency signal it received to a low frequency signal.

FIG. 10 is a diagram showing a common high frequency amplifier and its bias circuit. An electronic circuit 10 includes a high frequency amplifier, and a bias circuit 20 generates bias voltages V1 and V2 having a constant potential that are supplied to the electronic circuit 10. In the electronic circuit 10 in this example, a load R1 and an amplification transistor X1 are connected between a positive power source $V_{DD}$ and the ground. A high frequency input RFin is supplied to the gate of the transistor X1 and a high frequency output RFout is generated at its drain. In addition, bias voltage V1 is applied to the gate. With this arrangement, a signal which the high frequency input RFin is superimposed on the bias voltage V1 is applied between the gate and the source, and the high frequency output RFout, obtained by amplification, is generated at the drain terminal.

In the bias circuit in this example, resistors R41, R42, R43 and R44 are connected in series between the positive voltage source $V_{DD}$ and the ground, and in this example, a constant voltage divided by the resistances is generated at nodes N41 and N42. The voltages at nodes N41 and N42 are supplied via the respective resistors R45 and R46 to the electronic circuit 10.

In the bias circuit 20 of a resistance division type shown in FIG. 10, the bias voltages V1 and V2 are almost constant. However, the MMIC generates, for example, a metal gate electrode relative to an active layer having a predetermined thickness on the surface of the substrate, and applies a voltage between the gate and the source, so that an depletion extending from the gate electrode to the active layer is expanded or narrowed to control a drain current value. Since during the manufacturing process the thicknesses of the active layer and the metal gate electrode vary in manufacture, the characteristic of the bias circuit 20 tends to fluctuate.

For the high frequency amplification transistor X1 in FIG. 10, therefore, the static characteristics, such as pinch-off voltage Vp and drain saturated current $I_{DSS}$, are greatly changed due to the manufacturing differences. And thus, when the bias voltage V1 to be applied to the gate is constant, as is described above, an appropriate bias voltage can not be applied relative to the varying static characteristic of the FETx1, an amplification rate and a dynamic range are changed, a drain current of a design value can not be obtained, and a desired characteristic for the operation of a high frequency amplifier can not be provided.

SUMMARY OF THE INVENTION

It is, therefore, one object of the present invention to provide a bias circuit that resolves the above shortcomings.

It is another object of the present invention to provide a bias circuit that can, to a degree, maintain the characteristic of a high frequency circuit relative to manufacturing differences.

To achieve the above objects, according to the present invention, an integrated circuit device comprises:

a high frequency electronic circuit having a first enhancement transistor, to the gate of which, at least, a bias voltage is applied; and a bias circuit, including, a second enhancement transistor formed on a substrate on which the first enhancement transistor is formed, and first, second and third resistors connected in series between a positive power source and a power source ground, in which a connection point of the first and the second resistors is connected to a drain of the second enhancement transistor, a connection point of the second and the third resistors is connected to a gate of the second enhancement transistor, and voltages at the connection point of the second resistor and the third resistor or at a terminal which is closer to the power source ground is applied as a bias voltage to the high frequency electronic circuit.

Since provided in the bias circuit is an enhancement transistor which is formed on a substrate on which the electronic circuit is formed and which processes a high frequency signal, even if the static characteristics of the transistor fluctuate due to variances introduced during the manufacturing process, the bias voltage varies accordingly. As a result, the transistor in the electronic circuit has a substantially constant operating characteristic.

In addition, according to the present invention, the resistances of the first and the second resistors are so set that a voltage at the connection point of the first and the second resistors that fluctuates due to a change in a drain current that accompanies a characteristic variance, occupies a range wherein a drain current of the second transistor is almost constant even though the voltage fluctuation.

DETAILED DESCRIPTION OF THE PREFERRED EMBODIMENTS

The preferred embodiments of the present invention will now be described while referring to the accompanying drawings. Note, however, that the technical scope of the present invention is not limited by the above embodiments.

Figure 1:
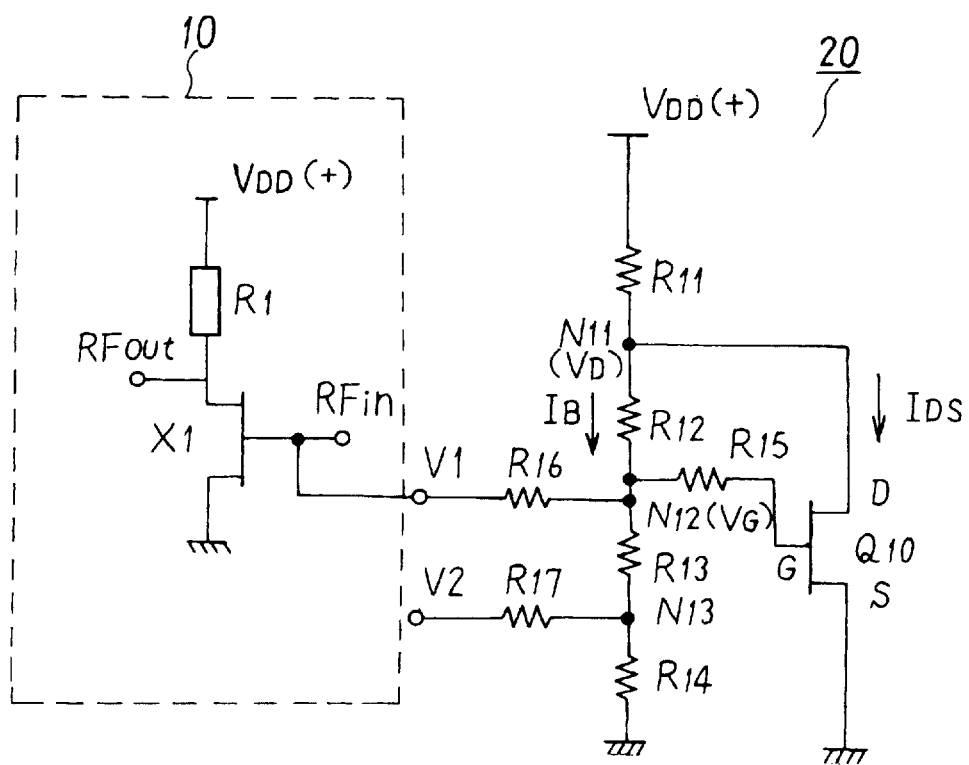
FIG. 1 is a circuit diagram for one embodiment of the present invention.
Figure 10:
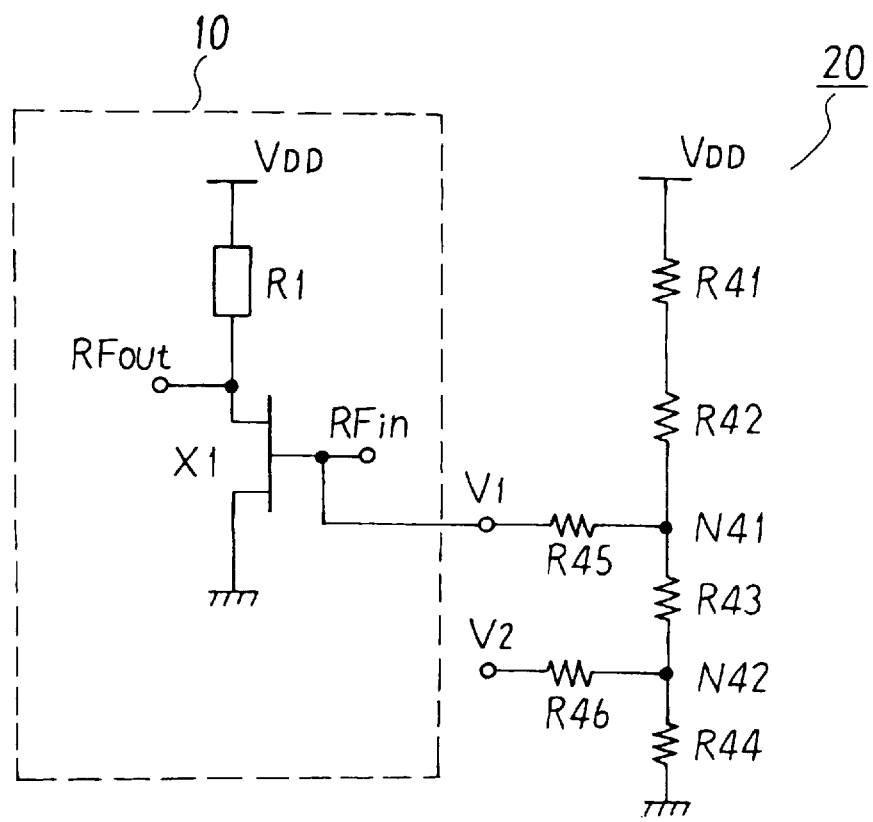
FIG. 10 is a diagram showing a common amplifier and its bias circuit.

FIG. 1 is a circuit diagram for one embodiment of the present invention. The same circuit as the high frequency amplifier in FIG. 10 is shown as an electronic circuit 10. More specifically, load R1 and FET transistor X1 are connected between positive power source $V_{DD}$ and the power source ground, high frequency input RFin and bias voltage V1 are applied to the gate of the transistor X1, and a high frequency output RFout, obtained by amplification, is generated at its drain terminal.

A bias circuit 20 includes resistors R11, R12, R13 and R14, which are connected in series between positive power source $V_{DD}$ and the power source ground; and FED transistor Q10, the drain of which is connected to node N11, which is a connection point of resistors R11 and R12, the source of which is connected to the ground power source, and the gate of which is connected via resistor R15 to node N12, which is a connection point of resistors R12 and R13. Voltage $V_G$ at node N12, for example, is supplied to the electronic circuit 10, via resistor R16, as bias voltage V1. Similarly, the voltage at node N13, which is a connection point of resistors R13 and R14, is supplied to the electronic circuit 10, via resistor R17, as bias voltage V2.

The bias circuit 20 is formed on a semiconductor substrate on which the electronic circuit 10 is also formed. Therefore, the static characteristics of the enhancement transistor Q10 in the bias circuit 20 and of the enhancement transistor X1 in the electronic circuit 10 are changed equally due to the manufacturing differences.

Figure 2:
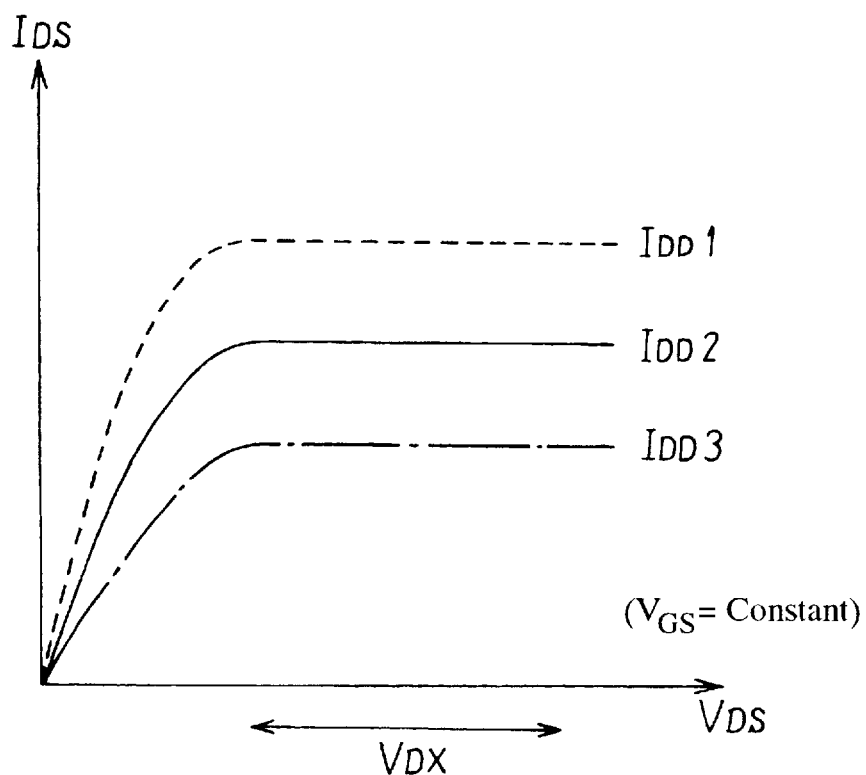
FIG. 2 is a graph showing the static characteristic of a transistor.
Figure 3:
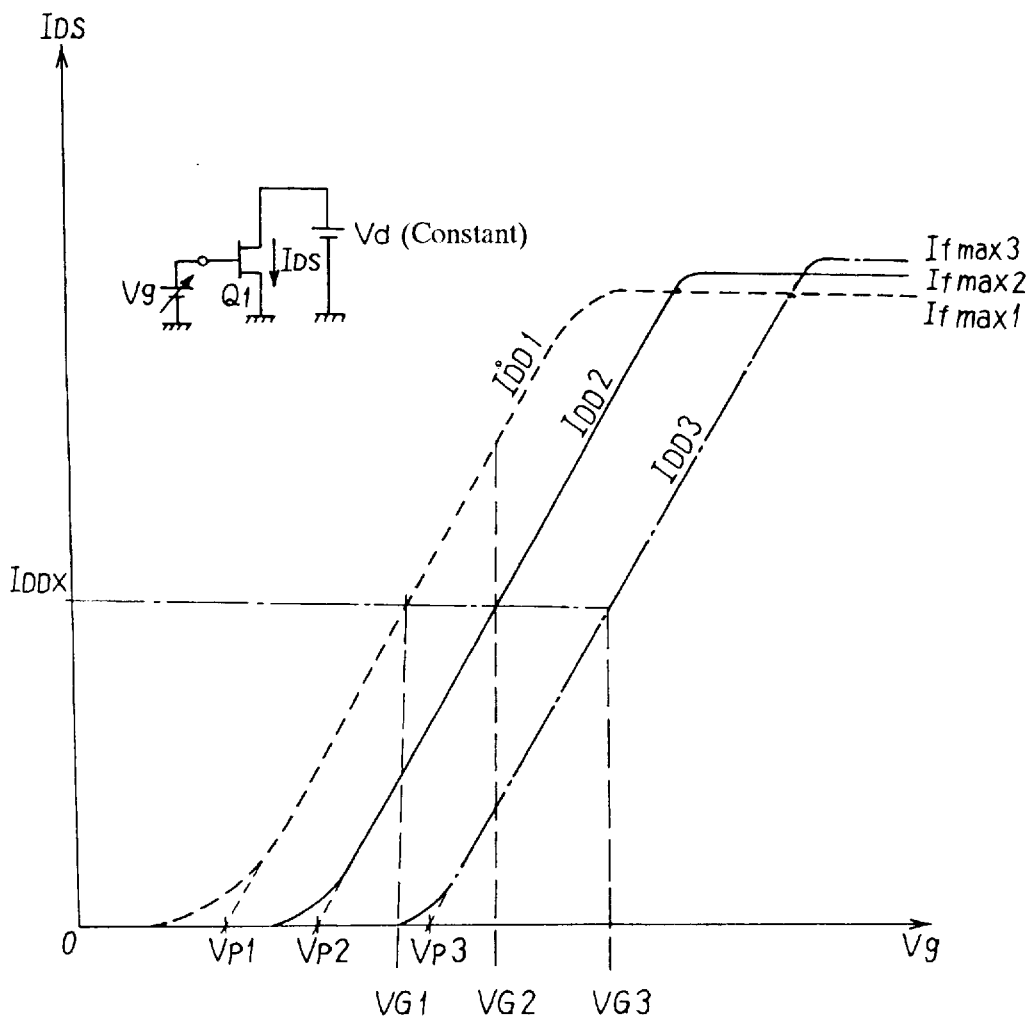
FIG. 3 is a graph showing the static characteristic of a transistor.

FIGS. 2 and 3 are graphs showing the static characteristic of the transistor shown in FIG. 1. In FIG. 2 is shown the characteristic of a drain current $I_{DS}$ relative to changes in the drain-source voltage $V_{DS}$ when gate-source voltage $V_{GS}$ is constant. Because of the manufacturing differences, the characteristic of the drain current $I_{DS}$ is changed as indicated by broken line $I_{DD1}$, or by chained line $I_{DD3}$, relative to the characteristic curve $I_{DD2}$ indicated by the solid line. In FIG. 3 is shown a graph for a drain current $I_{DS}$, when, as is shown in the graph, gate-source voltage $V_G$ is changed by application of constant voltage $V_D$ between the source and the drain of the transistor Q1. In this case, because of the manufacturing differences, the characteristic fluctuates as is indicated by broken line $I_{DD1}$, or chained line $I_{DD3}$, relative to characteristic curve $I_{DD2}$, which is indicated by a solid line. Vp1, Vp2 and Vp3 denote pinch-off voltages, and Ifmax1, Ifmax2 and Ifmax3 denote drain saturated currents.

Assuming that the characteristics $I_{DD2}$ indicated by the solid lines in FIGS. 2 and 3 are ideal static characteristics, the gate bias voltage of the transistor X1 is set to $V_{G2}$ in FIG. 3. However, when due to manufacturing differences the characteristic is changed to $I_{DD1}$, which is indicated by a broken line, or $I_{DD3}$, which is indicated by a chained line, the bias point and an operating area fluctuate greatly upon the application of the gate bias voltage $V_{G2}$.

Referring back to FIG. 1, the transistor Q10 is provided in the bias circuit 20, node N11 is connected to the drain of the transistor Q10, and node N12 is connected to the gate via resistor R15. The bias voltages V1 and V2 are altered by using a change, in the drain current $I_{DS}$ of the transistor Q10, that occurs because of manufacturing differences. As a result, the characteristic of the amplification transistor X1 in the electronic circuit 10 is compensated due to the change of the bias voltages V1 and V2.

The operation of the bias circuit 20 is as follows. The relationship of drain current $I_D$ of the transistor Q10 and current $I_B$ flowing across the resistors is:

$$I_{DS} \geq I_B \qquad (1).$$

The drain voltage $V_D$ of the transistor Q10 is lower than the positive power voltage $V_{DD}$ by the equivalent of a voltage drop at the resistor R11 caused by the drain current $I_{DS}$:

$$V_D = V_{DD} - R11 \times I_{DS} \qquad (2).$$

It should be noted that the drain voltage $V_D$ falls in a range for voltage $V_{DX}$ represented in the static characteristic of the transistor in FIG. 2. The drain current $I_{DS}$ at this time does not depend on the drain voltage $V_D$ and is constant. The voltage at node N12 is gate voltage $V_G$ of the transistor Q10, and its potential is lower than the drain voltage $V_D$ at the node N11 by the equivalent of a voltage drop of the resistor R12 caused by the current $I_B$:

$$V_G = V_D - R12 \times I_B \qquad (3).$$

As is shown in FIG. 3, since the drain current $I_{DS}$ is unconditionally determined relative to the gate voltage $V_G$, the drain current $I_{DS}$ and the gate voltage $V_G$ of the transistor Q10, having a predetermined relationship, are balanced. The initial values at the terminals of the transistor Q10 have been explained above.

The above described initial setup condition is $I_{DS=IDD2}$ $V_{D=VG2}$.

In other words, the static characteristic is set to the static characteristic $I_{DD2}$ indicated by the solid lines in FIG. 2 and 3. This initial condition corresponds to an ideal setup value.

An explanation will be given for a case where the static characteristics of the transistors Q10 and X1 are varied because of the manufacturing differences. Assume that the static characteristics are changed as is indicated by the broken lines in FIGS. 2 and 3. Then, the drain current $I_D$ is increased to $I_{DD1}$, and the drain voltage $V_D$ is reduced by above expression (2). Similarly, the gate voltage $V_G$ is reduced by above expression (3). The fall of the gate voltage $V_G$ reduces the drain current $I_{DS}$ of the transistor Q10. Therefore, at a point where the two are balanced, the drain $12_{DS}$ of the transistor Q10 has an increased value and the gate voltage $V_G$ has a reduced value.

On the other hand, when the drain currents $I_{DS}$ of the transistors Q10 and X1 fluctuate in the reduction direction, as is indicted by the chained lines in FIGS. 2 and 3, the drain voltage $V_D$ is increased by expression (2), and accordingly, the gate voltage $V_G$ is increased by expression (3). An increase in the gate voltage $V_G$ is accompanied by an increase in the drain current $I_{DS}$ of the transistor Q10. Therefore, at a point where the two are balanced, the drain current $I_{DS}$ has a reduced value and the gate voltage $V_G$ has an increased value.

As is described above, even when the drain current $I_{DS}$ of the transistor is increased by the fluctuation of the process, the fall in the gate voltage $V_G$ drops the bias voltage V1, and the bias voltage of the amplification transistor X1 in the electronic circuit 10 is changed as is indicated by $V_{G1}$ in FIG. 3. An increase in the drain current of the transistor X11 is prevented, and the drain current is held at a bias point for design value $I_{DDX}$. On the other hand, even when the drain current $I_{DS}$ of the transistor is reduced by the process change, the gate voltage $V_G$ of the bias circuit 20 is increased, and the bias voltage V1 applied to the electronic circuit 10 is also increased. As a result, as is shown in FIG. 3, the gate bias voltage V1 of the amplification transistor X1 is changed as is indicated by $V_{G3}$ in FIG. 3, and is held as the drain current at the bias point for design value $I_{DDX}$.

As is described above, even though the drain current of the transistor is altered by changes in the manufacturing process, the relationship between the gate bias voltage $V_{G2}$ and the characteristic indicated by solid line $I_{DD1}$ is maintained as the operating characteristic of the electronic circuit 10. That is, the characteristic of the transistor X1 in the electronic circuit 10 does not depend on changes in the manufacturing process and an ideal operating characteristic can be maintained.

Figure 4:
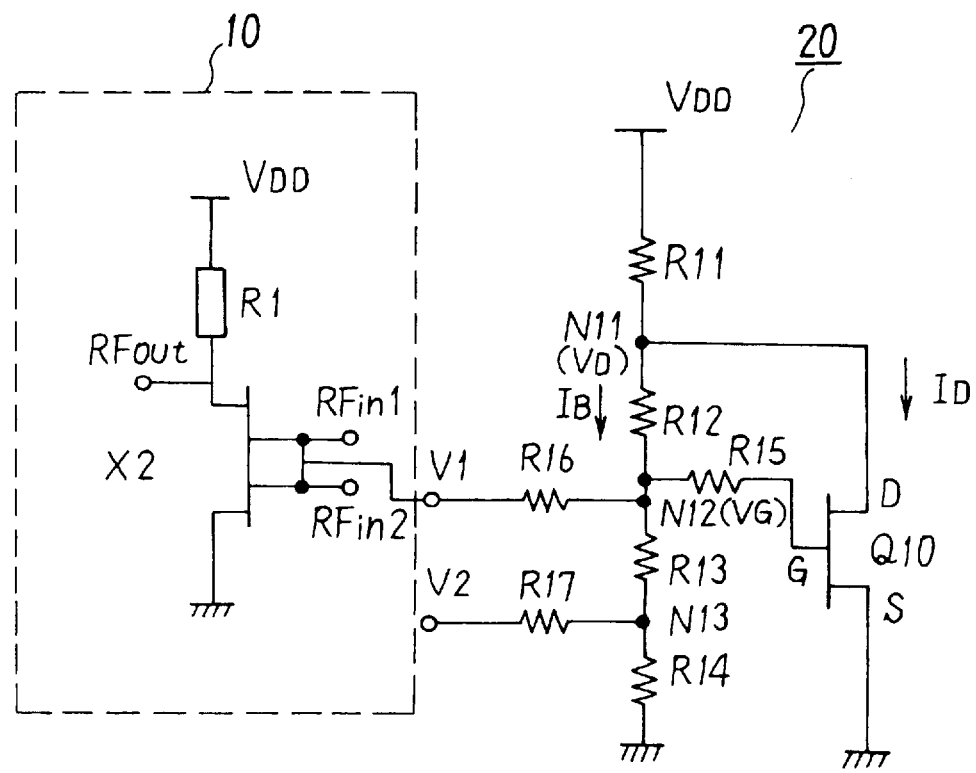
FIG. 4 is a circuit diagram for the embodiment of the present invention.

FIG. 4 is a diagram for an embodiment of the present invention. The bias circuit 20 in this embodiment has the same structure as has the bias circuit 20 in FIG. 1, while a frequency converter is employed as the electronic circuit 10. The frequency converter converts a specific high frequency RFin1 to provide a low frequency and generates the resultant output RFout. An enhancement transistor X2 has a gate to which the high frequency input RFin1 is applied, and a gate to which a high frequency signal RFin2 having a local frequency is applied. The same bias voltage V1 is applied to the two gates. With this arrangement, the output RFout is generated as a frequency that is the difference between the frequency of the input signal RFin1 and the frequency of input signal RFin2. In the frequency converter, the transistor X2, as well as the transistor X1 in FIG. 1, can maintain an ideal operating characteristic that does not depend on changes in the manufacturing process. The principle is the same as that explained while referring to FIGS. 1, 2 and 3, and no explanation for it will be given.

Figure 5:
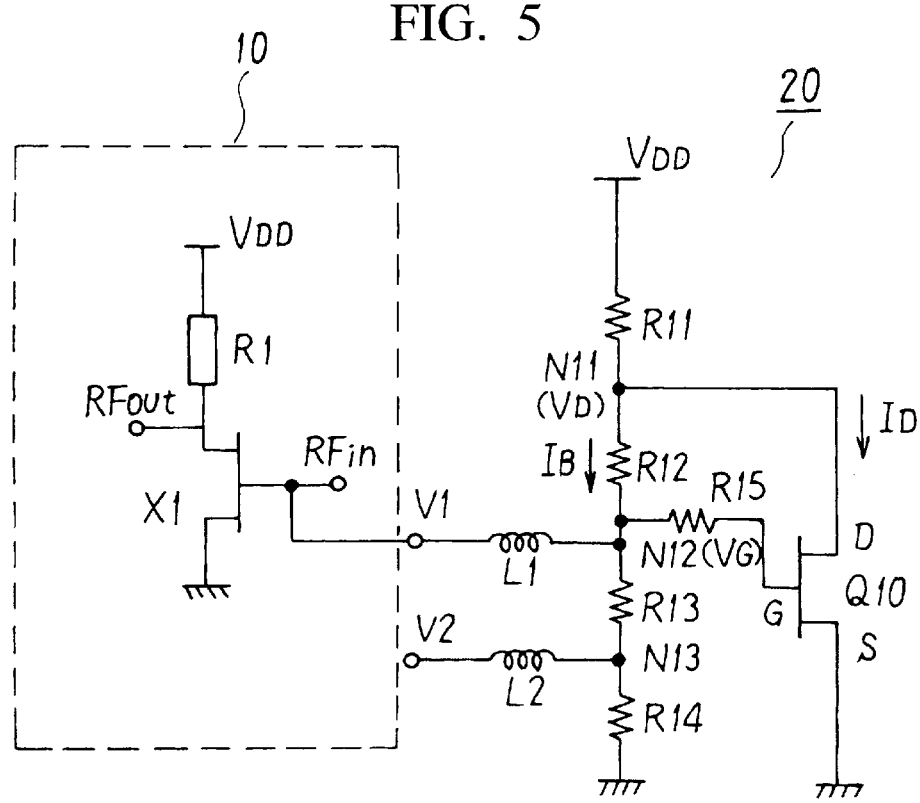
FIG. 5 is a circuit diagram for another embodiment of the present invention.

FIG. 5 is a circuit diagram for another embodiment of the present invention. The high frequency amplifier in FIG. 1 is employed as an electronic circuit 10. The structure of a bias circuit 20 is the same as that in FIG. 1. Inductor L1 is inserted between node N12 and an output point for bias voltage V1, and inductor L2 is inserted between node N13 and an output point for bias voltage V2. With this arrangement, a high impedance for the bias circuit 20 viewed from the electronic circuit 10 side is effected because of a high frequency in the electronic circuit 10. Therefore, as is shown in FIG. 1 or FIG. 4, the impedance of the bias circuit 20 is sufficiently higher than those of resistors R16 and R17 to reduce the loss in the electronic circuit 10.

Figure 6A:
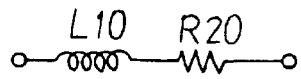
FIGS. 6A through 6C are diagrams showing other examples of inductors L1 and L2 in FIG. 5 for reducing loss.
Figure 6B:
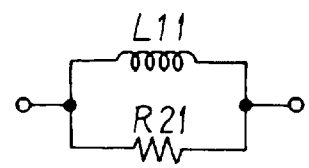
Figure 6C:
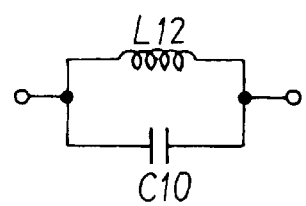

FIGS. 6A, 6B and 6C are diagrams illustrating other examples of the inductors L1 and L2 in FIG. 5 for reducing loss. FIG. 6A is a diagram showing the series connection of inductor L10 and resistor R20. When compared with the independent connections provided for the inductors L1 and L2 alone in FIG. 5, the inductance is lower. Generally, an inductor in a MMIC requires a large area to increase its inductance. Therefore, while taking the area efficiency in the integrated circuit into consideration, increasing of the inductance for the reduction in the loss in the electronic circuit is not preferable. Since the circuit is arranged as is shown in FIG. 6A, the area for the inductor L10 can be small.

FIG. 6B is a diagram showing a parallel circuit comprising inductor L11 and resistor R21. In this circuit, a suffi ciently high impedance can be acquired relative to a high frequency signal in the electronic circuit 10. In addition, since the resistor R21 is connected in parallel in the high frequency circuit, the impedance of the parallel circuit is satisfactorily high, even though the inductance of the inductor L11 is small.

FIG. 6C is a diagram showing a parallel circuit comprising inductor L12 and capacitor C10. This parallel circuit is operated as a resonance circuit relative to the frequency of the electronic circuit 10. Therefore, this circuit has a high impedance relative to a signal having a resonance frequency. The values for the inductor L12 and the capacitor C10 are appropriately set in accordance with the frequency in the electronic circuit 10.

Figure 7:
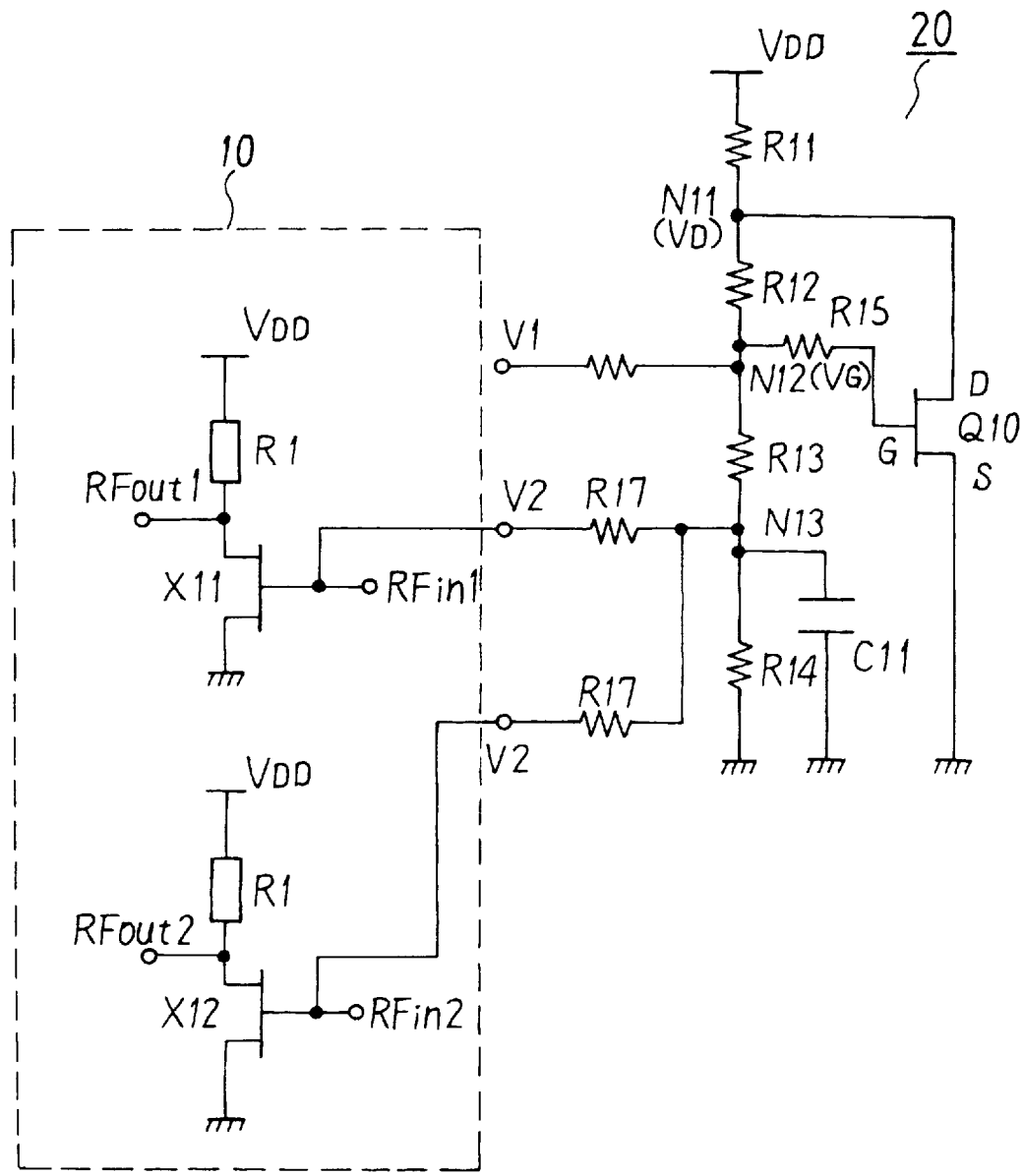
FIG. 7 is a circuit diagram for an additional embodiment of the present invention.

FIG. 7 is a circuit diagram for an additional embodiment of the present invention. Two high frequency amplifiers are provided in an electronic circuit 10, and the same bias voltage V2 is applied to the gates of transistors X11 and X12. High frequency input RFin1 is applied to the gate of the transistor X11, and another high frequency signal RFin2 is applied to the gate of the transistor X12. Therefore, the gates of the transistors X11 and X12 are connected together via resistors R17, and in order to prevent them from interfering with each other, capacitor C11 is additionally provided between node N13 and the ground in a bias circuit 20.

Figure 8:
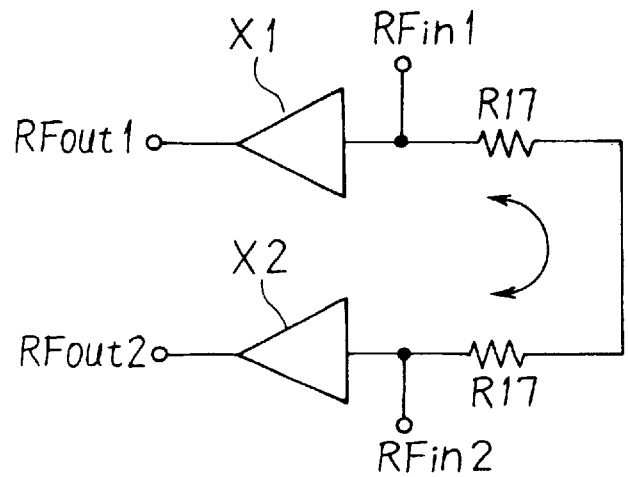
FIG. 8 is a diagram showing mutual interference in FIG. 7.
Figure 9:
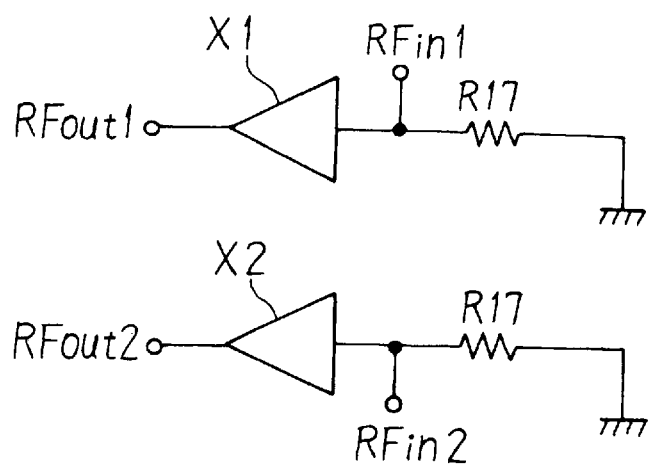
FIG. 9 is a diagram showing isolation in FIG. 7.

FIG. 8 is a diagram showing the mutual interference in FIG. 7. As is described above, since the same bias voltage V2 is applied to the gates of the two amplifiers, both input terminals are short-circuited via the resistors R17. As a result, mutual interference by two high frequency input signals RFin1 and RFin2 occurs. When the capacitor C11 is additionally provided for the bias circuit 20, the capacitor C11 short-circuits the node N13 and the ground power source relative to the high frequency input signal. Therefore, as is shown in FIG. 9 for isolation in FIG. 7, the resistors R17 are effectively grounded. As a result, the mutual interference shown in FIG. 8 can be prevented.

As is described above, according to the present invention, since the transistor is formed, during the same manufacturing process, on a substrate on which a transistor in an electronic circuit is formed, and is employed for a bias circuit, a bias voltage can be generated that is changed in association with an alteration of a transistor characteristic caused by changes in the manufacturing process. When the drain current is increased due to a change in the manufacturing process, the bias voltage is reduced, and when the drain current is reduced, the bias voltage is increased, so that an ideal operating characteristic can be maintained for the transistor in the electronic circuit.

What is claimed is:

1. An integrated circuit device comprising:
   a high frequency electronic circuit having a first enhancement transistor, to the gate of which, at least, a bias voltage is applied; and
   a bias circuit, including,
      a second enhancement transistor formed on a substrate on which said first enhancement transistor is formed, and
      first, second and third resistors connected in series between a positive power source and a power source ground,
      in which a connection point of said first and said second resistors is connected to a drain of said second enhancement transistor, a connection point of said second and said third resistors is connected to a gate of said second enhancement transistor, and voltages at said connection point of said second resistor and said third resistor or at a terminal which is closer to said power source ground is applied as a bias voltage to said high frequency electronic circuit.

2. An integrated circuit device according to claim 1, wherein resistances of said first and said second resistors are so set that a voltage at said connection point of said first and said second resistors that fluctuates due to a change in a drain current that accompanies a characteristic variance, occupies a range wherein a drain current of said second transistor is almost constant even though the voltage fluctuation.

3. An integrated circuit device according to claim 1, wherein said connection point of said second resistor and said third resistor, or a terminal closer to said power source ground is connected via a predetermined inductance device to a gate of said first transistor.

4. An integrated circuit device according to claim 1, wherein a predetermined capacitor is connected between said connection point of said second and said third resistors or said terminal closer to said power source ground, and said power source.

* * * * *